(12) United States Patent
Arai et al.

(10) Patent No.: US 6,801,417 B2
(45) Date of Patent: Oct. 5, 2004

(54) SEMICONDUCTOR INTEGRATED CIRCUIT DEVICE

(75) Inventors: Katsuya Arai, Kyoto (JP); Toshihiro Kohgami, Kyoto (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 233 days.

(21) Appl. No.: 10/195,366

(22) Filed: Jul. 16, 2002

(65) Prior Publication Data

US 2003/0016480 A1 Jan. 23, 2003

(30) Foreign Application Priority Data

Jul. 19, 2001 (JP) ........................................ 2001-219196

(51) Int. Cl.[7] .............................................. H02H 9/00
(52) U.S. Cl. ...................................................... 361/56
(58) Field of Search .................................. 361/56, 111

(56) References Cited

U.S. PATENT DOCUMENTS 6,002,538 A * 12/1999 Kanegae et al. .............. 360/46
6,144,542 A * 11/2000 Ker et al. .................... 361/111
6,437,407 B1 * 8/2002 Ker et al. .................... 257/357

* cited by examiner

Primary Examiner—Gregory J. Toatley, Jr.
Assistant Examiner—Boris Benenson
(74) Attorney, Agent, or Firm—McDermott Will & Emery LLP

(57) ABSTRACT

A semiconductor integrated circuit device includes an external connection pad, an electrostatic discharge protection circuit, an output circuit, an output pre-buffer circuit and an internal circuit, and is configured so that the output circuit is protected by the electrostatic discharge protection circuit from a surge entering through the external connection pad. A substrate-potential-fixing PMIS transistor whose gate is connected to the external connection pad is provided between an n-type substrate region (n well) and a power supply line. When a positive charge is applied to the external connection pad in an ESD test, the substrate-potential-fixing PMIS transistor is turned OFF, thereby suppressing an increase in the potential of the power supply line and suppressing a decrease in the surge withstand voltage of the output circuit.

18 Claims, 8 Drawing Sheets

SEMICONDUCTOR INTEGRATED CIRCUIT DEVICE

BACKGROUND OF THE INVENTION

The present invention relates to a semiconductor integrated circuit device including an electrostatic discharge (ESD) protection circuit. In recent years, the degree of integration of a semiconductor integrated circuit device has been increasing along with the technical advancements in the manufacturing process, i.e., a reduction in size and an increase in density. Along with this, such a device has become more vulnerable to damages caused by an electrostatic discharge (hereinafter referred to as a "surge"). There are increased possibilities that an element such as an input circuit, an output circuit, an input/output circuit or an internal circuit is broken, or the characteristics thereof are deteriorated, by a surge entering through an external connection pad, for example. Therefore, the external connection pad is often provided with a protection circuit for protecting the input circuit, the output circuit, the input/output circuit or the internal circuit from a surge.

FIG. 7 is an electric circuit diagram illustrating a configuration of an output circuit and other elements around the output circuit in a conventional semiconductor integrated circuit device including an electrostatic discharge protection circuit. As illustrated in FIG. 7, the semiconductor integrated circuit device includes an external connection pad 101, an electrostatic discharge protection circuit 102, an output circuit 103, an output pre-buffer circuit 104, and an internal circuit 121, and is configured so that the output circuit 103 is protected by the electrostatic discharge protection circuit 102 from a surge entering through the external connection pad 101.

The electrostatic discharge protection circuit 102 is provided between the external connection pad 101 and the output circuit 103, and includes a PMIS transistor 105, an NMIS transistor 106, a first resistor 107 and a second resistor 108. The PMIS transistor 105 includes a source connected to a power supply line 119 for supplying a power supply voltage VDD, a gate connected to the power supply line 119 via the first resistor 107, a drain connected to the external connection pad 101, and a substrate region (n well) connected to the power supply line 119. Moreover, the NMIS transistor 106 includes a source connected to a ground line 120 for supplying a ground voltage VSS, a gate connected to the ground line 120 via the second resistor 108, a drain connected to the external connection pad 101, and a substrate region (p well) connected to the ground line 120.

The output circuit 103 is provided between the electrostatic discharge protection circuit 102 and the output pre-buffer circuit 104, and includes a PMIS transistor 111 and an NMIS transistor 112. The PMIS transistor 111 includes a source connected to the power supply line 119, a gate connected to an output terminal of a first pre-buffer 115 of the output pre-buffer circuit 104, a drain connected to the external connection pad 101, and a substrate region (n well) connected to the power supply line 119. Moreover, the NMIS transistor 112 includes a source connected to the ground line 120, a gate connected to an output terminal of a second pre-buffer 117 of the output pre-buffer circuit 104, a drain connected to the external connection pad 101, and a substrate region (p well) connected to the ground line 120.

The output pre-buffer circuit 104 for amplifying an output signal from the internal circuit 121 is provided between the internal circuit 121 and the output circuit 103, and includes a first pre-buffer circuit 116 that includes the first pre-buffer 115 in the last stage and a second pre-buffer current 118 that includes the second pre-buffer 117 in the last stage. The first pre-buffer 115 includes a power supply voltage terminal connected to the power supply line 119, a ground terminal connected to the ground line 120, an output terminal connected to the gate of the PMIS transistor 111 of the output circuit 103, and an input terminal connected to the internal circuit 121. Moreover, the second pre-buffer 117 includes a power supply voltage terminal connected to the power supply line 119, a ground terminal connected to the ground line 120, an output terminal connected to the gate of the NMIS transistor 112 of the output circuit 103, and an input terminal connected to the internal circuit 121. Note that the first pre-buffer circuit 116 and the second pre-buffer current 118 each include a plurality of pre-buffers according to the degree of amplification by which an output signal from the internal circuit 121 is to be amplified. The first and second pre-buffer circuits 116 and 118 are configured so that two high and low output signals or two identical output signals are output from the output terminal of the first pre-buffer 115 in the last stage in the first pre-buffer circuit 116 and from the output terminal of the second pre-buffer 117 in the last stage in the second pre-buffer current 118.

With the conventional semiconductor integrated circuit device having such a configuration, a surge applied between the power supply line 119 and the external connection pad 101 is absorbed by the breakdown of the PMIS transistor 105, and a surge applied between the ground line 120 and the external connection pad 101 is absorbed by the breakdown of the NMIS transistor 106. Thus, it is possible to effectively protect the output circuit 103 from a surge entering from the outside through the external connection pad 101.

Incidentally, a semiconductor integrated circuit device needs to meet an ESD test standard because it is required to assure the user of a certain surge breakdown withstand voltage. In recent years, a human body model (HBM) ESD test standard such as an MIL standard has become the global standard as an ESD test standard, and a semiconductor integrated circuit device needs to meet the HBM test standard.

FIG. 8A is a circuit diagram illustrating an evaluation circuit for conducting an ESD test based on the HBM test standard, and FIG. 8B is a waveform diagram illustrating HBM discharge waveform specifications of the MIL standard.

As illustrated in FIG. 8A, the evaluation circuit includes a charging power supply 150 and a discharging resistor 153 having a resistance of R=1.5 k$\Omega$, which are arranged respectively in two circuits (the left-side circuit and the right-side circuit illustrated in FIG. 8A), which are arranged in parallel with respect to a charging/discharging capacitor 151 having a capacitance of C=100 pF. A selector switch 152 is connected to one electrode of the charging/discharging capacitor 151, and the selector switch 152 is used to selectively connect the one electrode of the charging/discharging capacitor 151 either to a high-voltage portion of the variable-voltage charging power supply 150 or to the discharging resistor 153. Moreover, the other electrode of the charging/discharging capacitor 151 is connected to a low-voltage portion of the charging power supply 150 in the left-side circuit illustrated in FIG. 8A, and is connected to the discharging resistor 153 in the right-side circuit illustrated in FIG. 8A. Then, a subject device 154 is placed in the right-side circuit illustrated in FIG. 8A between the other electrode of the charging/discharging capacitor 151 and the discharging resistor 153 so as to conduct an ESD test on the subject device 154.

In the ESD test using the evaluation circuit, one electrode of the charging/discharging capacitor 151 is first connected to the charging power supply 150 by using the selector switch 152. Then, the left-side circuit illustrated in FIG. 8A becomes a closed circuit, and the charging/discharging capacitor 151 is charged by the charging power supply 150 so that the charged voltage thereof is 4000 V, for example. Then, the electrode of the charging/discharging capacitor 151 is switched to the discharging resistor 153 by using the selector switch 152. Then, the right-side circuit illustrated in FIG. 8A becomes a closed circuit, and the charge stored in the charging/discharging capacitor 151 is applied to the subject device 154, which is a semiconductor integrated circuit device, via the discharging resistor 153.

The test is conducted based on the HBM discharge waveform specifications as illustrated in FIG. 8B. In FIG. 8B, the horizontal axis represents the stress application time, the vertical axis represents the surge current (A), Tr denotes the rise time (ns), and Td denotes the attenuation time (ns).

In the conventional semiconductor integrated circuit device illustrated in FIG. 7, the power supply voltage VDD and the ground voltage VSS are connected to the power supply line 119 and the ground line 120, respectively, during normal use. On the other hand, the ESD test based on the HBM test standard is conducted while the power supply line 119 is in an open state with its potential being unfixed, and the ground line 120 is fixed to the ground voltage VSS. Thus, in the right-side circuit of the evaluation circuit illustrated in FIG. 8A, the voltage between the two electrodes of the charging/discharging capacitor 151 is applied to the discharging resistor 153 and the semiconductor integrated circuit device (subject device 154). At this time, a voltage that has been lowered by the discharging resistor 153 is applied to the external connection pads of the input circuit and the output circuit (the input circuit and the external connection circuit of the input circuit are not shown). Note that a positive or negative charge is applied to the external connection pad 101 of the output circuit illustrated in FIG. 7, and it is determined whether the ESD standard is satisfied.

However, when the conventional semiconductor integrated circuit device illustrated in FIG. 7 is subjected to an ESD test based on the HBM test standard (Vss ground), the NMIS transistor 112 of the output circuit 103 may be locally damaged, and the withstand voltage thereof may decrease.

It is believed that the damage to the NMIS transistor 112 and the decrease in the withstand voltage thereof occur due to the following reason.

When a positive charge is applied to the external connection pad 101 while the power supply line 119 is in an open state and the ground line 120 is fixed to the voltage Vss, the p-n junction between the drain region and the substrate region of the PMIS transistor 105 becomes a parasitic forward diode 109, and the p-n junction between the drain region and the substrate region of the PMIS transistor 111 becomes a parasitic forward diode 113, in the circuit extending from the external connection pad 101 to the power supply line 119. On the other hand, in the circuit extending from the external connection pad 101 to the ground line 120, the p-n junction between the drain region and the substrate region of the NMIS transistor 106 becomes a parasitic reverse diode 110, and the p-n junction between the drain region and the substrate region of the NMIS transistor 112 becomes a parasitic reverse diode 114.

Therefore, the positive charge applied to the external connection pad 101 flows into the power supply line 119 through the parasitic forward diodes 109 and 113 to increase the potential of the power supply line 119, thereby increasing the potential of the power supply voltage terminal of the second pre-buffer 117. At this time, while the gate potential of the NMIS transistor 106 of the electrostatic discharge protection circuit 102 is fixed to the ground potential, the gate potential of the NMIS transistor 112 of the output circuit 103 is in an uncertain state. Therefore, as the potential of the power supply voltage terminal of the second pre-buffer 117 increases, the NMIS transistor 112 is turned ON before the NMIS transistor 106 is turned ON, whereby an electrostatic discharge current (surge current) flows locally through the NMIS transistor 112. It is believed that this is the cause of the local damage to the NMIS transistor 112 and the decrease in the withstand voltage thereof.

SUMMARY OF THE INVENTION

An object of the present invention is to provide a semiconductor integrated circuit device including an electrostatic discharge protection circuit with an ESD protection capability that satisfies the requirements in a surge test based on the HBM test standard.

A first semiconductor integrated circuit device of the present invention includes: an external connection pad; an electrostatic discharge protection circuit connected to the external connection pad; an output circuit connected to the external connection pad; an output pre-buffer circuit connected to the output circuit; a first power supply line for supplying a power supply voltage to the electrostatic discharge protection circuit and the output circuit; and a second power supply line for supplying a power supply voltage to the output pre-buffer circuit, wherein the first power supply line and the second power supply line are electrically separated from each other.

Thus, the first power supply line for supplying the power supply voltage to the electrostatic discharge protection circuit and the output circuit and the second power supply line for supplying the power supply voltage to the output pre-buffer circuit are electrically separated from each other, whereby the potential of the second power supply line will not be increased by the application of a positive charge to the external connection pad during an ESD test. Therefore, the activation of an element in the output pre-buffer circuit is suppressed, thereby suppressing the early activation of a certain element, prior to the activation of others, in the output circuit due to the activation of the element in the output pre-buffer circuit. Thus, it is possible to suppress a surge breakdown due to a localized current flow to the certain element in the output circuit, and it is possible to obtain a semiconductor integrated circuit device having a high surge withstand voltage.

In one embodiment of the present invention, the semiconductor integrated circuit device further includes: an input buffer circuit connected to the external connection pad; and a protection resistor provided between the external connection pad and the input buffer circuit. In this way, the electrostatic discharge protection circuit can function as a protection circuit for the output circuit and the input buffer circuit.

In one embodiment of the present invention: the electrostatic discharge protection circuit includes a first PMIS transistor and a first NMIS transistor, the first PMIS transistor including a source connected to the first power supply line, a drain connected to the external connection pad and an n-type substrate region connected to the first power supply line, and the first NMIS transistor including a source connected to a ground line, a drain connected to the external connection pad and a p-type substrate region connected to the ground line; the output pre-buffer circuit includes a first pre-buffer circuit and a second pre-buffer circuit, the first pre-buffer circuit including, in a last stage, a first pre-buffer whose power supply terminal is connected to the second power supply line, and the second pre-buffer circuit including, in a last stage, a second pre-buffer whose power supply terminal is connected to the second power supply line; and the output circuit includes a second PMIS transistor and a second NMIS transistor, the second PMIS transistor including a source connected to the first power supply line, a drain connected to the external connection pad, a gate connected to an output terminal of the first pre-buffer and an n-type substrate region connected to the first power supply line, and the second NMIS transistor including a source connected to a ground line, a drain connected to the external connection pad, a gate connected to an output terminal of the second pre-buffer and a p-type substrate region connected to the ground line. In this way, it is possible to prevent the second NMIS transistor from being activated prior to the activation of the first NMIS transistor in response to the output from the second pre-buffer during an ESD test. Thus, it is possible to suppress a decrease in the surge withstand voltage due to a localized current flow to the second NMIS transistor.

It is preferred that the semiconductor integrated circuit device further includes: a first resistor provided between a gate of the first PMIS transistor and the first power supply line; and a second resistor provided between a gate of the first NMIS transistor and the ground line.

In one embodiment of the present invention, the semiconductor integrated circuit device further includes: a third PMIS transistor including a gate connected to the ground line, a source connected to the first power supply line and a drain connected to a gate of the first PMIS transistor; a first resistor provided between the third PMIS transistor and the ground line; a third NMIS transistor including a gate connected to the first power supply line, a source connected to the ground line and a drain connected to a gate of the first NMIS transistor; and a second resistor provided between the gate of the third NMIS transistor and the first power supply line. In this way, the third PMIS transistor and the third NMIS transistor can function as resistors, whereby it is possible to reduce the area to be occupied by the semiconductor integrated circuit device.

A second semiconductor integrated circuit device of the present invention includes: an external connection pad; an electrostatic discharge protection circuit connected to the external connection pad and including an n-type substrate region; an output circuit connected to the external connection pad and including an n-type substrate region; an output pre-buffer circuit connected to the output circuit; a first power supply line for supplying a power supply voltage to the electrostatic discharge protection circuit and the output circuit; and a second power supply line for fixing a potential of the n-type substrate region of each of the electrostatic discharge protection circuit and the output circuit, wherein the first power supply line and the second power supply line are electrically separated from each other.

Thus, the first power supply line for supplying the power supply voltage to the electrostatic discharge protection circuit and the output circuit and the second power supply line for fixing the potential of the n-type substrate region are electrically separated from each other, whereby it is possible to suppress the flow of a positive charge to the first power supply line via the forward parasitic diodes of the first and second PMIS transistors upon application of a positive charge to the external connection pad during an ESD test, thus suppressing an increase in the potential of the first power supply line. Therefore, the activation of an element in the output pre-buffer circuit is suppressed, thereby suppressing the early activation of a certain element, prior to the activation of others, in the output circuit due to the activation of the element in the output pre-buffer circuit. Thus, it is possible to suppress a surge breakdown due to a localized current flow to the certain element in the output circuit, and it is possible to obtain a semiconductor integrated circuit device having a high surge withstand voltage.

In one embodiment of the present invention, the semiconductor integrated circuit device further includes: an input buffer circuit connected to the external connection pad; and a protection resistor provided between the external connection pad and the input buffer circuit. In this way, the electrostatic discharge protection circuit can function as a protection circuit for the output circuit and the input buffer circuit.

In one embodiment of the present invention: the electrostatic discharge protection circuit includes a first PMIS transistor and a first NMIS transistor, the first PMIS transistor including a source connected to the first power supply line, a drain connected to the external connection pad and the n-type substrate region connected to the second power supply line, and the first NMIS transistor including a source connected to a ground line, a drain connected to the external connection pad and a p-type substrate region connected to the ground line; the output pre-buffer circuit includes a first pre-buffer circuit and a second pre-buffer circuit, the first pre-buffer circuit including, in a last stage, a first pre-buffer whose power supply terminal is connected to the first power supply line, and the second pre-buffer circuit including, in a last stage, a second pre-buffer whose power supply terminal is connected to the first power supply line; and the output circuit includes a second PMIS transistor and a second NMIS transistor, the second PMIS transistor including a source connected to the first power supply line, a drain connected to the external connection pad, a gate connected to an output terminal of the first pre-buffer and the n-type substrate region connected to the second power supply line, and the second NMIS transistor including a source connected to a ground line, a drain connected to the external connection pad, a gate connected to an output terminal of the second pre-buffer and a p-type substrate region connected to the ground line. In this way, it is possible to prevent the second NMIS transistor from being activated prior to the activation of the first NMIS transistor in response to the output from the second pre-buffer during an ESD test. Thus, it is possible to suppress a decrease in the surge withstand voltage due to a localized current flow to the second NMIS transistor.

It is preferred that the semiconductor integrated circuit device further includes: a first resistor provided between a gate of the first PMIS transistor and the first power line supply; and a second resistor provided between a gate of the first NMIS transistor and the ground line.

In one embodiment of the present invention, the semiconductor integrated circuit device further includes: a third PMIS transistor including a gate connected to the ground line, a source connected to the first power supply line and a drain connected to a gate of the first PMIS transistor; a first resistor provided between the third PMIS transistor and the ground line; a third NMIS transistor including a gate connected to the first power supply line, a source connected to the ground line and a drain connected to a gate of the first NMIS transistor; and a second resistor provided between the gate of the third NMIS transistor and the first power supply line. In this way, the third PMIS transistor and the third NMIS transistor can function as resistors, whereby it is possible to reduce the area to be occupied by the semiconductor integrated circuit device.

In one embodiment of the present invention, the semiconductor integrated circuit device further includes: a fourth PMIS transistor including a gate connected to the first power supply line, a source connected to the external connection pad and a drain connected to the gate of the first PMIS transistor; and a fifth PMIS transistor including a gate connected to the first power supply line, a source connected to the external connection pad and a drain connected to the gate of the second PMIS transistor. In this way, it is possible to reliably keep the first and second PMIS transistors OFF, whereby even when a high voltage is applied to the external connection pad during an ESD test, it is possible to suppress the movement of a positive charge to the first power supply line through the first and second PMIS transistors. Thus, the effects as described above can be realized more reliably.

A third semiconductor integrated circuit device of the present invention includes: an external connection pad; an electrostatic discharge protection circuit connected to the external connection pad and including an n-type substrate region; an output circuit connected to the external connection pad and including an n-type substrate region; an output pre-buffer circuit connected to the output circuit; a power supply line for supplying a power supply voltage to the electrostatic discharge protection circuit, the output circuit and the output pre-buffer circuit; and a substrate-potential-fixing PMIS transistor for fixing a potential of the n-type substrate region of each of the electrostatic discharge protection circuit and the output circuit, the substrate-potential-fixing PMIS transistor including a gate connected to the external connection pad, a source connected to the power supply line and a drain connected to the n-type substrate region of each of the electrostatic discharge protection circuit and the output circuit.

In this way, even if a parasitic forward diode is formed with the n-type substrate region of each of the electrostatic discharge protection circuit and the output circuit being one pole upon application of a positive charge to the external connection pad in an ESD test, the substrate-potential-fixing PMIS transistor is turned OFF upon application of a positive charge to the external connection pad since the gate of the substrate-potential-fixing PMIS transistor is connected to the external connection pad. Therefore, it is possible to suppress an increase in the potential of the power supply line due to a charge flowing into the power supply line from the electrostatic discharge protection circuit or the output circuit. Therefore, the activation of an element in the output pre-buffer circuit is suppressed, thereby suppressing the early activation of a certain element, prior to the activation of others, in the output circuit due to the activation of the element in the output pre-buffer circuit. Thus, it is possible to suppress a surge breakdown due to a localized current flow to the certain element in the output circuit, and it is possible to obtain a semiconductor integrated circuit device having a high surge withstand voltage.

In one embodiment of the present invention, the semiconductor integrated circuit device further includes: an input buffer circuit connected to the external connection pad; and a protection resistor provided between the external connection pad and the input buffer circuit. In this way, the electrostatic discharge protection circuit can function as a protection circuit for the output circuit and the input buffer circuit.

In one embodiment of the present invention: the electrostatic discharge protection circuit includes a first PMIS transistor and a first NMIS transistor, the first PMIS transistor including a source connected to the power supply line, a drain connected to the external connection pad and the n-type substrate region connected to the drain of the substrate-potential-fixing PMIS transistor, and the first NMIS transistor including a source connected to a ground line, a drain connected to the external connection pad and a p-type substrate region connected to the ground line; the output pre-buffer circuit includes a first pre-buffer circuit and a second pre-buffer circuit, the first pre-buffer circuit including, in a last stage, a first pre-buffer whose power supply terminal is connected to the power supply line, and the second pre-buffer circuit including, in a last stage, a second pre-buffer whose power supply terminal is connected to the power supply line; and the output circuit includes a second PMIS transistor and a second NMIS transistor, the second PMIS transistor including a source connected to the power supply line, a drain connected to the external connection pad, a gate connected to an output terminal of the first pre-buffer and the n-type substrate region connected to the drain of the substrate-potential-fixing PMIS transistor, and the second NMIS transistor including a source connected to a ground line, a drain connected to the external connection pad, a gate connected to an output terminal of the second pre-buffer and a p-type substrate region connected to the ground line. In this way, it is possible to prevent the second NMIS transistor from being activated prior to the activation of the first NMIS transistor in response to the output from the second pre-buffer during an ESD test. Thus, it is possible to suppress a decrease in the surge withstand voltage due to a localized current flow to the second NMIS transistor.

It is preferred that the semiconductor integrated circuit device further includes: a first resistor provided between a gate of the first PMIS transistor and the power supply line; and a second resistor provided between a gate of the first NMIS transistor and the ground line.

In one embodiment of the present invention, the semiconductor integrated circuit device further includes: a third PMIS transistor including a gate connected to the ground line, a source connected to the power supply line and a drain connected to a gate of the first PMIS transistor; a first resistor provided between the third PMIS transistor and the ground line; a third NMIS transistor including a gate connected to the power supply line, a source connected to the ground line and a drain connected to a gate of the first NMIS transistor; and a second resistor provided between the gate of the third NMIS transistor and the power supply line. In this way, the third PMIS transistor and the third NMIS transistor can function as resistors, whereby it is possible to reduce the area to be occupied by the semiconductor integrated circuit device.

In one embodiment of the present invention, the semiconductor integrated circuit device further includes: a fourth PMIS transistor including a gate connected to the power supply line, a source connected to the external connection pad and a drain connected to the gate of the first PMIS transistor; and a fifth PMIS transistor including a gate connected to the power supply line, a source connected to the external connection pad and a drain connected to the gate of the second PMIS transistor. In this way, it is possible to reliably keep the first and second PMIS transistors OFF, whereby even when a high voltage is applied to the external connection pad during an ESD test, it is possible to suppress the movement of a positive charge to the power supply line through the first and second PMIS transistors. Thus, the effects as described above can be realized more reliably.

In one embodiment of the present invention, the semiconductor integrated circuit device further includes: a first time-constant-adjusting resistor provided between the gate of the fourth PMIS transistor and the power supply line; a first potential-fixing capacitor having one pole connected to the gate of the fourth PMIS transistor and the other pole connected to the ground line; a second time-constant-adjusting resistor provided between the gate of the fifth PMIS transistor and the power supply line; and a second potential-fixing capacitor having one pole connected to the gate of the fifth PMIS transistor and the other pole connected to the ground line. In this way, the gate voltage of each of the fourth and fifth PMIS transistors is held at a low potential from the beginning of an ESD test, whereby the first and second PMIS transistors can be kept OFF reliably by the fourth and fifth PMIS transistors. Thus, the effects as described above can be realized more reliably.

DESCRIPTION OF THE PREFERRED EMBODIMENTS

First Embodiment

Figure 1:
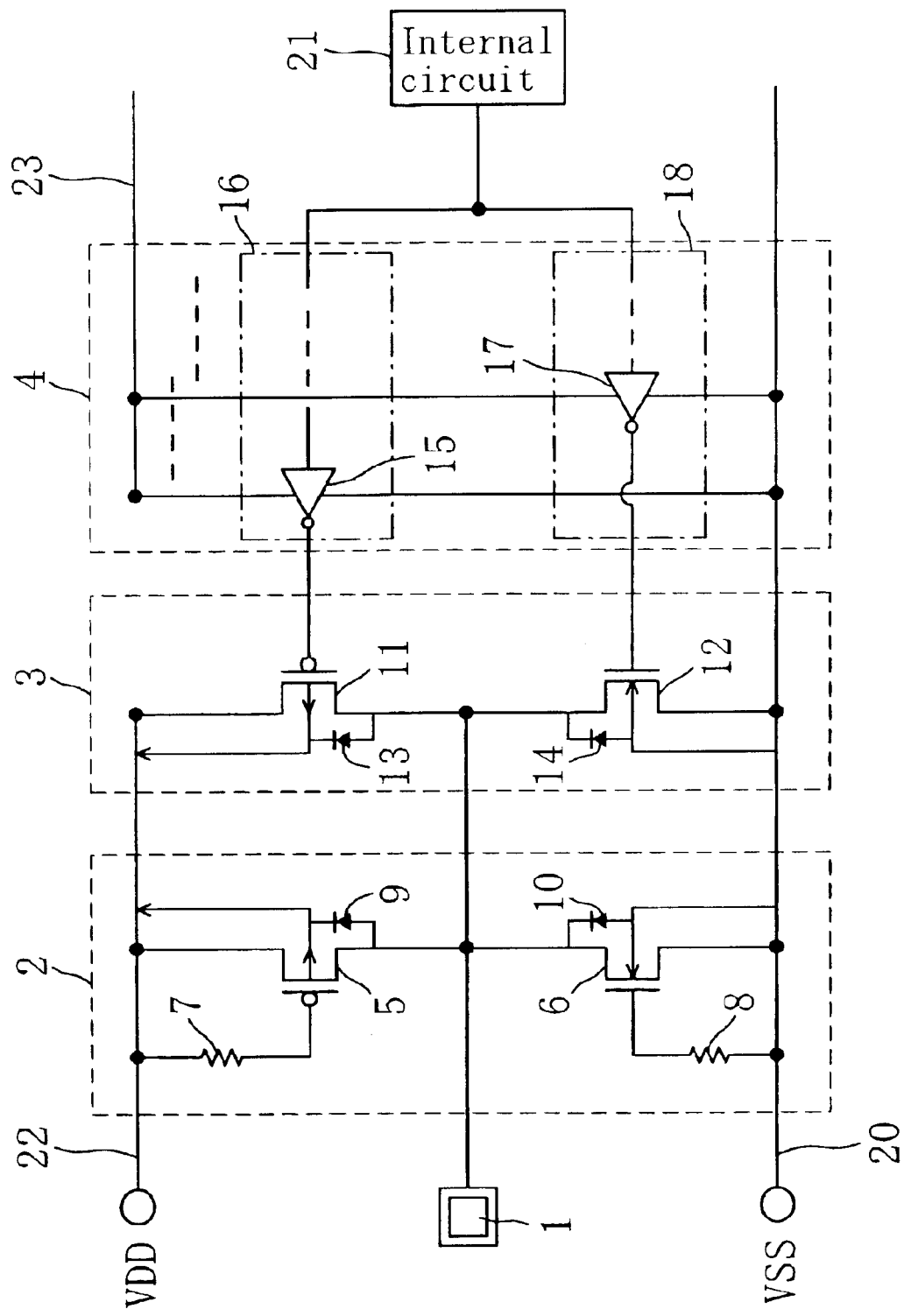
FIG. 1 is an electric circuit diagram illustrating a configuration of an output circuit and other elements around the output circuit in a semiconductor integrated circuit device according to the first embodiment of the present invention.

FIG. 1 is an electric circuit diagram illustrating a configuration of an output circuit and other elements around the output circuit in a semiconductor integrated circuit device including an electrostatic discharge protection circuit according to the first embodiment of the present invention. As illustrated in FIG. 1, the semiconductor integrated circuit device includes an external connection pad 1, an electrostatic discharge protection circuit 2, an output circuit 3, an output pre-buffer circuit 4 and an internal circuit 21, and is configured so that the output circuit 3 is protected by the electrostatic discharge protection circuit 2 from a surge entering through the external connection pad 1. A feature of the present embodiment is the provision of a first power supply line 22 and a second power supply line 23, which are electrically separated from each other.

The electrostatic discharge protection circuit 2 is provided between the external connection pad 1 and the output circuit 3, and includes a PMIS transistor 5, an NMIS transistor 6, a first resistor 7 and a second resistor 8. The PMIS transistor 5 includes a source connected to the first power supply line 22 for supplying a power supply voltage VDD, a gate connected to the first power supply line 22 via the first resistor 7, a drain connected to the external connection pad 1, and a substrate region (n well) connected to the first power supply line 22. Moreover, the NMIS transistor 6 includes a source connected to a ground line 20 for supplying a ground voltage VSS, a gate connected to the ground line 20 via the second resistor 8, a drain connected to the external connection pad 1, and a substrate region (p well) connected to the ground line 20.

The output circuit 3 is provided between the electrostatic discharge protection circuit 2 and the output pre-buffer circuit 4, and includes a PMIS transistor 11 and an NMIS transistor 12. The PMIS transistor 11 includes a source connected to the first power supply line 22, a gate connected to an output terminal of a first pre-buffer 15 of the output pre-buffer circuit 4, a drain connected to the external connection pad 1, and a substrate region (n well) connected to the first power supply line 22. Moreover, the NMIS transistor 12 includes a source connected to the ground line 20, a gate connected to an output terminal of a second pre-buffer 17 of the output pre-buffer circuit 4, a drain connected to the external connection pad 1, and a substrate region (p well) connected to the ground line 20.

The output pre-buffer circuit 4 for amplifying an output signal from the internal circuit 21 is provided between the internal circuit 21 and the output circuit 3, and includes a first pre-buffer circuit 16 that includes the first pre-buffer 15 in the last stage and a second pre-buffer current 18 that includes the second pre-buffer 17 in the last stage. The first pre-buffer 15 includes a power supply voltage terminal connected to the second power supply line 23, a ground terminal connected to the ground line 20, an output terminal connected to the gate of the PMIS transistor 11 of the output circuit 3, and an input terminal connected to the internal circuit 21. Moreover, the second pre-buffer 17 includes a power supply voltage terminal connected to the second power supply line 23, a ground terminal connected to the ground line 20, an output terminal connected to the gate of the NMIS transistor 12 of the output circuit 3, and an input terminal connected to the internal circuit 21. Note that the first pre-buffer circuit 16 and the second pre-buffer current 18 each include a plurality of pre-buffers according to the degree of amplification by which an output signal from the internal circuit 21 is to be amplified. The first and second pre-buffer circuits 16 and 18 are configured so that two high and low output signals or two identical output signals are output from the output terminal of the first pre-buffer 15 in the last stage in the first pre-buffer circuit 16 and from the output terminal of the second pre-buffer 17 in the last stage in the second pre-buffer current 18.

Figure 8A:
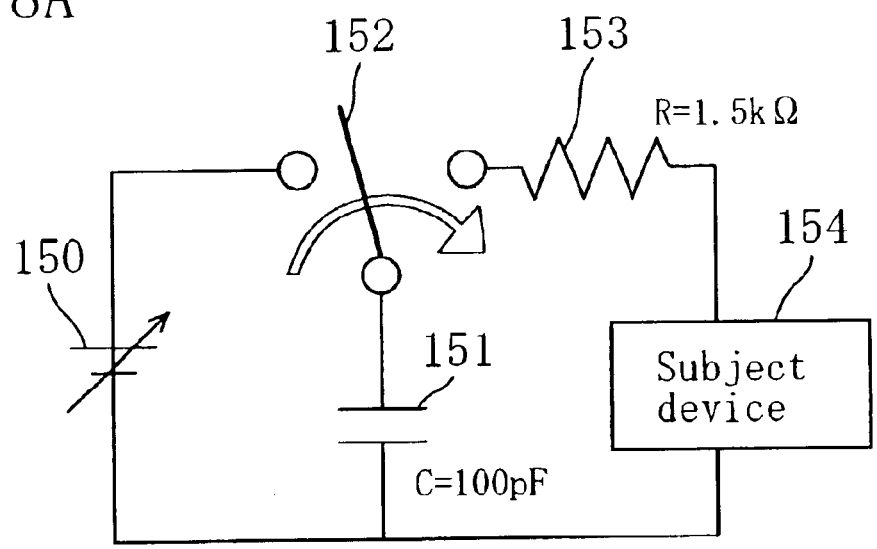
FIG. 8A is a circuit diagram illustrating an evaluation circuit for conducting an ESD test based on the HBM test standard.
Figure 8B:
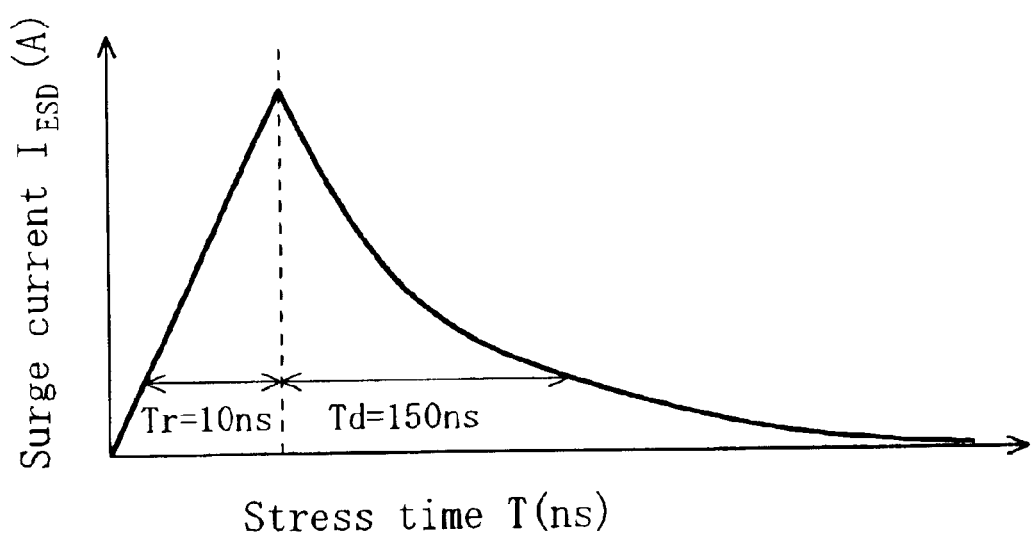
FIG. 8B is a waveform diagram illustrating HBM discharge waveform specifications of the MIL standard.

With the semiconductor integrated circuit device of the first embodiment, the first power supply line 22, to which the source and the substrate region (n well) of the PMIS transistor 5 of the electrostatic discharge protection circuit 2 and the source and the substrate region (n well) of the PMIS transistor 11 of the output circuit 3 are connected, is electrically separated from the second power supply line 23, to which the power supply voltage terminals of the first and second pre-buffers 15 and 17 of the output pre-buffer circuit 4 are connected. Thus, the first power supply line 22 and the second power supply line 23 are electrically separated from each other, whereby when an ESD test is conducted by using an evaluation circuit as illustrated in FIG. 8A based on the HBM discharge waveform specifications as illustrated in FIG. 8B, an increase in the potential of the second power supply line 23, to which the power supply voltage terminal of the second pre-buffer 17 is connected, is suppressed. Therefore, it is possible to prevent a situation where the gate voltage of the NMIS transistor 12 of the output circuit 3 is increased by the output from the second pre-buffer 17, thereby turning ON the NMIS transistor 12. Thus, it is possible to prevent the local damage to the NMIS transistor and the decrease in the surge withstand voltage thereof from occurring due to the NMIS transistor 12 being turned ON.

This effect will now be described in greater detail. When a positive charge is applied to the external connection pad 1 in the semiconductor integrated circuit device illustrated in FIG. 1 during an ESD test, the p-n junction between the drain region and the substrate region (n well) of the PMIS transistor 5 becomes a parasitic forward diode 9, and the p-n junction between the drain region and the substrate region (n well) of the PMIS transistor 11 becomes a parasitic forward diode 13, in the circuit extending from the external connection pad 1 to the first power supply line 22. On the other hand, in the circuit extending from the external connection pad 1 to the ground line 20, the p-n junction between the drain region and the substrate region (p well) of the NMIS transistor 6 becomes a parasitic reverse diode 10, and the p-n junction between the drain region and the substrate region (p well) of the NMIS transistor 12 becomes a parasitic reverse diode 14.

Therefore, the positive charge applied to the external connection pad 1 flows into the first power supply line 22 through the parasitic forward diodes 9 and 13 to increase the potential of the first power supply line 22.

However, it is possible to suppress an increase in the potential of the second power supply line 23, to which the power supply voltage terminals of the first pre-buffer 15 and the second pre-buffer 17 are connected, because the second power supply line 23 is electrically separated from the first power supply line 22. This suppresses an increase in the potential of the power supply voltage terminal of the second pre-buffer 17, whereby it is possible to prevent a high voltage signal from being output from the second pre-buffer 17 to the NMIS transistor 12 of the output circuit 3. Therefore, it is possible to prevent the NMIS transistor 12 of the output circuit 3 from being turned ON before the NMIS transistor 6 of the electrostatic discharge protection circuit 2 is turned ON, whereby it is possible to prevent a decrease in the surge withstand voltage.

Second Embodiment

Figure 2:
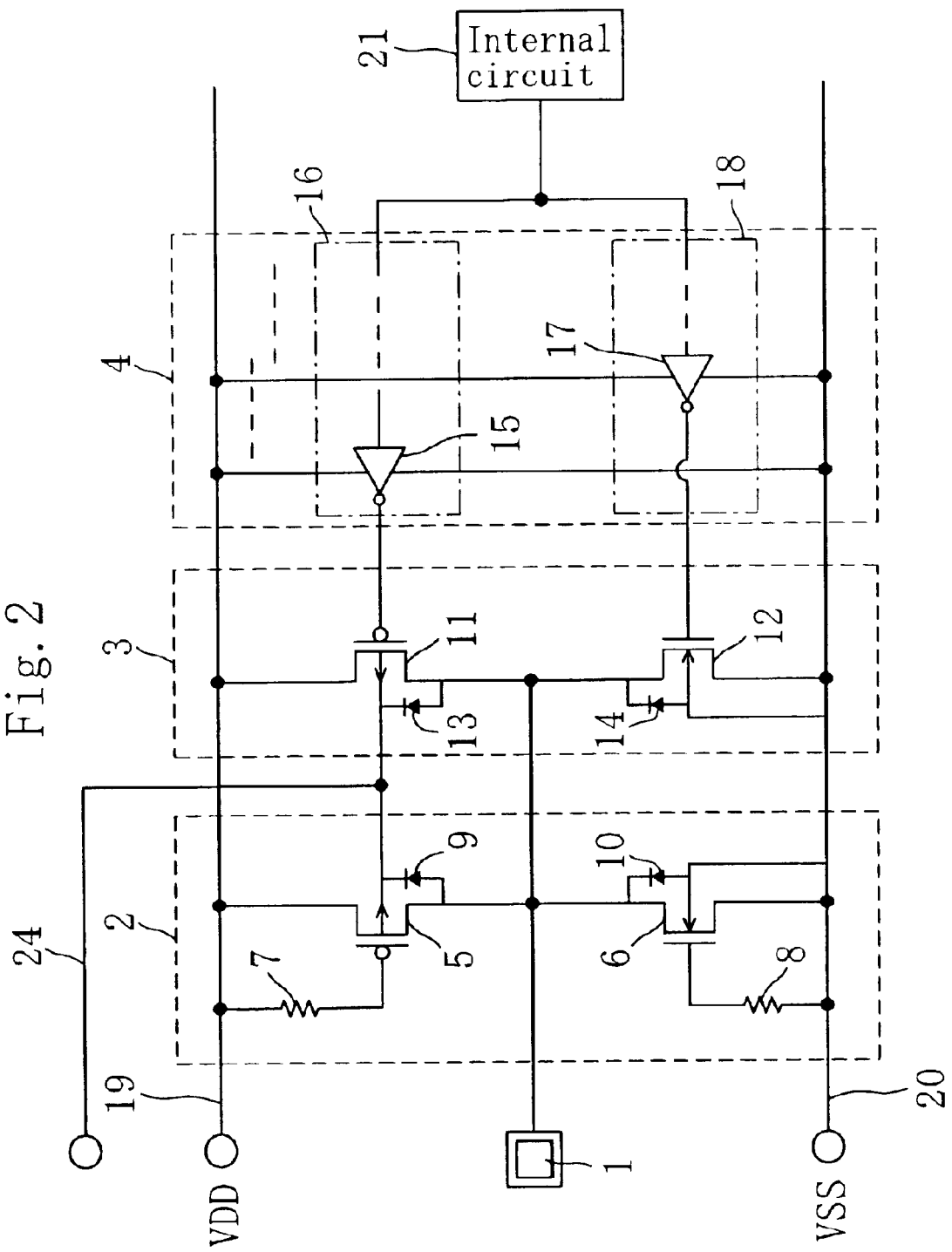
FIG. 2 is an electric circuit diagram illustrating a configuration of an output circuit and other elements around the output circuit in a semiconductor integrated circuit device according to the second embodiment of the present invention.

FIG. 2 is an electric circuit diagram illustrating a configuration of an output circuit and other elements around the output circuit in a semiconductor integrated circuit device including an electrostatic discharge protection circuit according to the second embodiment of the present invention. As illustrated in FIG. 2, the semiconductor integrated circuit device includes an external connection pad 1, an electrostatic discharge protection circuit 2, an output circuit 3, an output pre-buffer circuit 4 and an internal circuit 21, and is configured so that the output circuit 3 is protected by the electrostatic discharge protection circuit 2 from a surge entering through the external connection pad 1. A feature of the present embodiment is the provision of a substrate-potential-fixing power supply line 24, which is electrically separated from a power supply line 19.

The electrostatic discharge protection circuit 2 is provided between the external connection pad 1 and the output circuit 3, and includes a PMIS transistor 5, an NMIS transistor 6, a first resistor 7 and a second resistor 8. The PMIS transistor 5 includes a source connected to the power supply line 19 for supplying a power supply voltage VDD, a gate connected to the power supply line 19 via the first resistor 7, a drain connected to the external connection pad 1, and a substrate region (n well) connected to the substrate-potential-fixing power supply line 24. Moreover, the NMIS transistor 6 includes a source connected to a ground line 20 for supplying a ground voltage VSS, a gate connected to the ground line 20 via the second resistor 8, a drain connected to the external connection pad 1, and a substrate region (p well) connected to the ground line 20.

The output circuit 3 is provided between the electrostatic discharge protection circuit 2 and the output pre-buffer circuit 4, and includes a PMIS transistor 11 and an NMIS transistor 12. The PMIS transistor 11 includes a source connected to the power supply line 19, a gate connected to an output terminal of a first pre-buffer 15 of the output pre-buffer circuit 4, a drain connected to the external connection pad 1, and a substrate region (n well) connected to the substrate-potential-fixing power supply line 24. Moreover, the NMIS transistor 12 includes a source connected to the ground line 20, a gate connected to an output terminal of a second pre-buffer 17 of the output pre-buffer circuit 4, a drain connected to the external connection pad 1, and a substrate region (p well) connected to the ground line 20.

The output pre-buffer circuit 4 for amplifying an output signal from the internal circuit 21 is provided between the internal circuit 21 and the output circuit 3, and includes a first pre-buffer circuit 16 that includes the first pre-buffer 15 in the last stage and a second pre-buffer current 18 that includes the second pre-buffer 17 in the last stage. The first pre-buffer 15 includes a power supply voltage terminal connected to the power supply line 19, a ground terminal connected to the ground line 20, an output terminal connected to the gate of the PMIS transistor 11 of the output circuit 3, and an input terminal connected to the internal circuit 21. Moreover, the second pre-buffer 17 includes a power supply voltage terminal connected to the power supply line 19, a ground terminal connected to the ground line 20, an output terminal connected to the gate of the NMIS transistor 12 of the output circuit 3, and an input terminal connected to the internal circuit 21. Note that the first pre-buffer circuit 16 and the second pre-buffer current 18 each include a plurality of pre-buffers according to the degree of amplification by which an output signal from the internal circuit 21 is to be amplified. The pre-buffers of the first and second pre-buffer circuits 16 and 18 are configured so that two high and low output signals or two identical output signals are output from the output terminal of the first pre-buffer 15 in the last stage in the first pre-buffer circuit 16 and from the output terminal of the second pre-buffer 17 in the last stage in the second pre-buffer current 18.

With the semiconductor integrated circuit device of the present embodiment, the power supply line 19, to which the source of the PMIS transistor 5 of the electrostatic discharge protection circuit 2, the source of the PMIS transistor 11 of the output circuit 3 and the power supply voltage terminals of the first and second pre-buffers 15 and 17 of the output pre-buffer circuit 4 are connected, is electrically separated from the substrate-potential-fixing power supply line 24, to which the substrate region (n well) of the PMIS transistor 5 of the electrostatic discharge protection circuit 2 and the substrate region (n well) of the PMIS transistor 11 of the output circuit 3 are connected. Thus, the power supply line 19 and the substrate-potential-fixing power supply line 24 are electrically separated from each other, whereby when an ESD test is conducted by using an evaluation circuit as illustrated in FIG. 8A based on the HBM discharge waveform specifications as illustrated in FIG. 8B, an increase in the potential of the power supply line 19, to which the power supply voltage terminal of the second pre-buffer 17 is connected, is suppressed. Therefore, it is possible to prevent a situation where the gate voltage of the NMIS transistor 12 of the output circuit 3 is increased by the output from the second pre-buffer 17, thereby turning ON the NMIS transistor 12. Thus, it is possible to prevent the local damage to the NMIS transistor and the decrease in the surge withstand voltage thereof from occurring due to the NMIS transistor 12 being turned ON.

This effect will now be described in greater detail. When a positive charge is applied to the external connection pad 1 in the semiconductor integrated circuit device illustrated in FIG. 2 during an ESD test, the p-n junction between the drain region and the substrate region (n well) of the PMIS transistor 5 becomes a parasitic forward diode 9, and the p-n junction between the drain region and the substrate region (n well) of the PMIS transistor 11 becomes a parasitic forward diode 13, in the circuit extending from the external connection pad 1 to the substrate-potential-fixing power supply line 24. On the other hand, in the circuit extending from the external connection pad 1 to the ground line 20, the p-n junction between the drain region and the substrate region (p well) of the NMIS transistor 6 becomes a parasitic reverse diode 10, and the p-n junction between the drain region and the substrate region (p well) of the NMIS transistor 12 becomes a parasitic reverse diode 14.

Thus, the parasitic forward diode 9 and the parasitic forward diode 13 illustrated in FIG. 2 are not formed between the external connection pad 1 and the power supply line 19, but are formed between the external connection pad 1 and the substrate-potential-fixing power supply line 24. Therefore, the positive charge applied to the external connection pad 1 flows into the substrate-potential-fixing power supply line 24 through the parasitic forward diodes 9 and 13, thereby increasing the potential of the substrate-potential-fixing power supply line 24.

On the other hand, no parasitic forward diode is formed between the external connection pad 1 and the power supply line 19, whereby it is possible to suppress an increase in the potential of the power supply line 19. Therefore, it is possible to prevent a high voltage signal from being output from the second pre-buffer 17 to the NMIS transistor 12 of the output circuit 3. Therefore, it is possible to prevent the NMIS transistor 12 of the output circuit 3 from being turned ON before the NMIS transistor 6 of the electrostatic discharge protection circuit 2 is turned ON, whereby it is possible to prevent a decrease in the surge withstand voltage.

Third Embodiment

Figure 3:
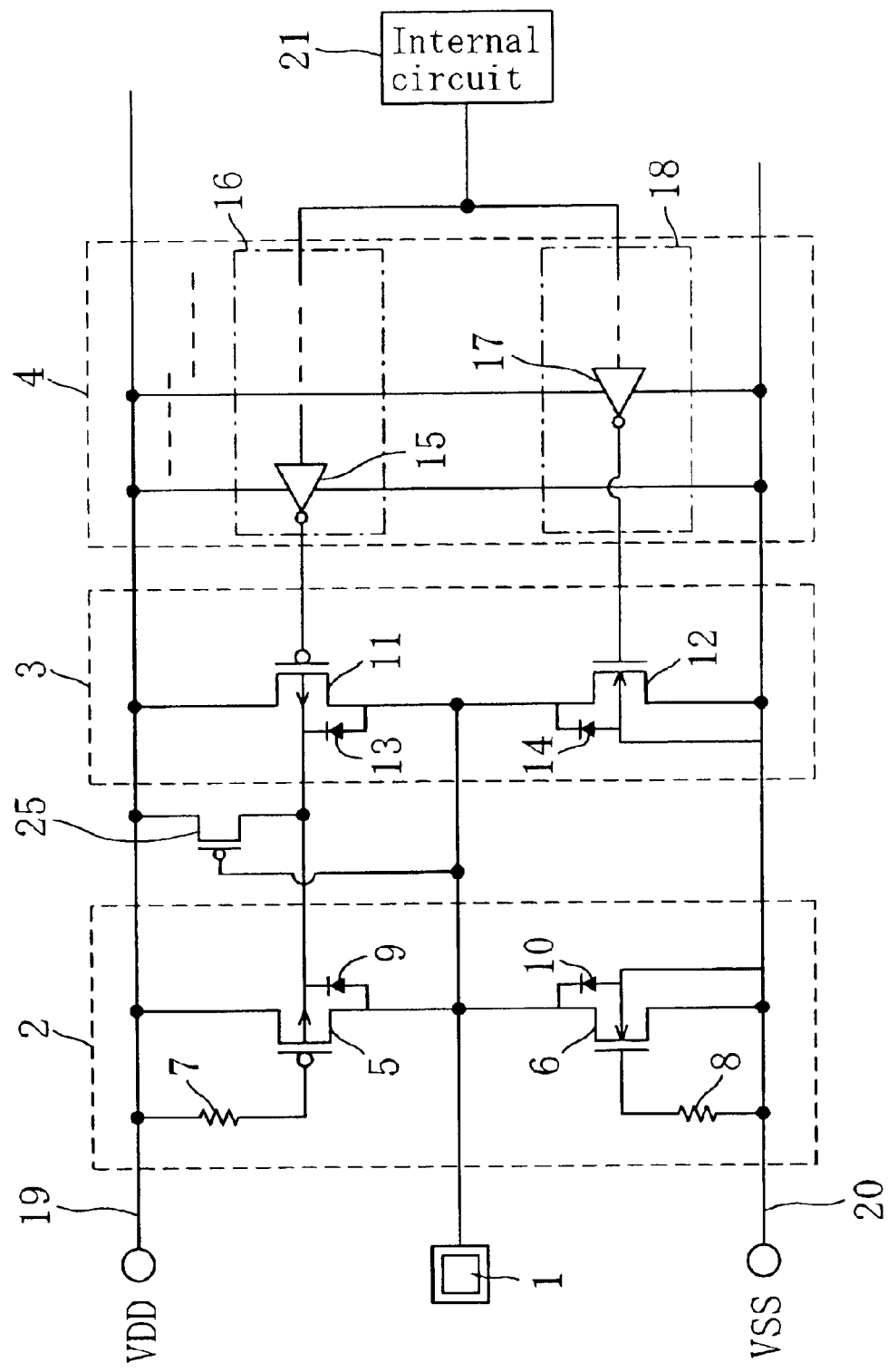
FIG. 3 is an electric circuit diagram illustrating a configuration of an output circuit and other elements around the output circuit in a semiconductor integrated circuit device according to the third embodiment of the present invention.

FIG. 3 is an electric circuit diagram illustrating a configuration of an output circuit and other elements around the output circuit in a semiconductor integrated circuit device including an electrostatic discharge protection circuit according to the third embodiment of the present invention. As illustrated in FIG. 3, the semiconductor integrated circuit device includes an external connection pad 1, an electrostatic discharge protection circuit 2, an output circuit 3, an output pre-buffer circuit 4 and an internal circuit 21, and is configured so that the output circuit 3 is protected by the electrostatic discharge protection circuit 2 from a surge entering through the external connection pad 1. A feature of the present embodiment is the provision of a substrate-potential-fixing PMIS transistor 25.

The electrostatic discharge protection circuit 2 is provided between the external connection pad 1 and the output circuit 3, and includes a PMIS transistor 5, an NMIS transistor 6, a first resistor 7 and a second resistor 8. The PMIS transistor 5 includes a source connected to the power supply line 19 for supplying a power supply voltage VDD, a gate connected to the power supply line 19 via the first resistor 7, a drain connected to the external connection pad 1, and a substrate region (n well) connected to the drain of the substrate-potential-fixing PMIS transistor 25. Moreover, the NMIS transistor 6 includes a source connected to a ground line 20 for supplying a ground voltage VSS, a gate connected to the ground line 20 via the second resistor 8, a drain connected to the external connection pad 1, and a substrate region (p well) connected to the ground line 20.

The output circuit 3 is provided between the electrostatic discharge protection circuit 2 and the output pre-buffer circuit 4, and includes a PMIS transistor 11 and an NMIS transistor 12. The PMIS transistor 11 includes a source connected to the power supply line 19, a gate connected to an output terminal of a first pre-buffer 15 of the output pre-buffer circuit 4, a drain connected to the external connection pad 1, and a substrate region (n well) connected to the drain of the substrate-potential-fixing PMIS transistor 25. Moreover, the NMIS transistor 12 includes a source connected to the ground line 20, a gate connected to an output terminal of a second pre-buffer 17 of the output pre-buffer circuit 4, a drain connected to the external connection pad 1, and a substrate region (p well) connected to the ground line 20.

The output pre-buffer circuit 4 for amplifying an output signal from the internal circuit 21 is provided between the internal circuit 21 and the output circuit 3, and includes a first pre-buffer circuit 16 that includes the first pre-buffer 15 in the last stage and a second pre-buffer current 18 that includes the second pre-buffer 17 in the last stage. The first pre-buffer 15 includes a power supply voltage terminal connected to the power supply line 19, a ground terminal connected to the ground line 20, an output terminal connected to the gate of the PMIS transistor 11 of the output circuit 3, and an input terminal connected to the internal circuit 21. Moreover, the second pre-buffer 17 includes a power supply voltage terminal connected to the power supply line 19, a ground terminal connected to the ground line 20, an output terminal connected to the gate of the NMIS transistor 12 of the output circuit 3, and an input terminal connected to the internal circuit 21. Note that the first pre-buffer circuit 16 and the second pre-buffer current 18 each include a plurality of pre-buffers according to the degree of amplification by which an output signal from the internal circuit 21 is to be amplified. The first and second pre-buffer circuits 16 and 18 are configured so that two high and low output signals or two identical output signals are output from the output terminal of the first pre-buffer 15 in the last stage in the first pre-buffer circuit 16 and from the output terminal of the second pre-buffer 17 in the last stage in the second pre-buffer current 18.

The gate of the substrate-potential-fixing PMIS transistor 25 is connected to the external connection pad 1, and the source thereof is connected to the power supply line 19.

With the semiconductor integrated circuit device of the present embodiment, the substrate region (n well) of the PMIS transistor 5 of the electrostatic discharge protection circuit 2 and the substrate region (n well) of the PMIS transistor 11 of the output circuit 3 are connected to the power supply line 19 via the substrate-potential-fixing PMIS transistor 25. Thus, the substrate-potential-fixing PMIS transistor 25 is provided between the substrate regions of the PMIS transistors 5 and 11 and the power supply line 19, whereby when an ESD test is conducted by using an evaluation circuit as illustrated in FIG. 8A based on the HBM discharge waveform specifications as illustrated in FIG. 8B, an increase in the potential of the power supply line 19, to which the power supply voltage terminal of the second pre-buffer 17 is connected, is suppressed. Therefore, it is possible to prevent a situation where the gate voltage of the NMIS transistor 12 of the output circuit 3 is increased by the output from the second pre-buffer 17, thereby turning ON the NMIS transistor 12. Thus, it is possible to prevent the local damage to the NMIS transistor and the decrease in the surge withstand voltage thereof from occurring due to the NMIS transistor 12 being turned ON.

This effect will now be described in greater detail. When a positive charge is applied to the external connection pad 1 in the semiconductor integrated circuit device illustrated in FIG. 2 during an ESD test, the p-n junction between the drain region and the substrate region (n well) of the PMIS transistor 5 becomes a parasitic forward diode 9, and the p-n junction between the drain region and the substrate region (n well) of the PMIS transistor 11 becomes a parasitic forward diode 13, in the circuit extending from the external connection pad 1 to the power supply line 19 via the substrate-potential-fixing PMIS transistor 25. On the other hand, in the circuit extending from the external connection pad 1 to the ground line 20, the p-n junction between the drain region and the substrate region (p well) of the NMIS transistor 6 becomes a parasitic reverse diode 10, and the p-n junction between the drain region and the substrate region (p well) of the NMIS transistor 12 becomes a parasitic reverse diode 14.

Since the gate of the substrate-potential-fixing PMIS transistor 25 is connected to the external connection pad 1, the substrate-potential-fixing PMIS transistor 25 is turned OFF when a positive charge is applied to the external connection pad 1, whereby the charge of the drain will not flow into the power supply line 19, and an increase in the potential of the power supply line 19 is suppressed. Therefore, it is possible to prevent the NMIS transistor 12 of the output circuit 3 from being turned ON before the NMIS transistor 6 of the electrostatic discharge protection circuit 2 is turned ON, whereby it is possible to prevent a decrease in the surge withstand voltage.

Particularly, the present embodiment is advantageous in that it is possible to suppress a decrease in the surge withstand voltage without increasing the number of power supply pins, whereas the number of power supply pins increases according to the number of power supply lines in the first and second embodiments described above.

Note however that during actual use, when a low voltage is applied to the external connection pad 1, there is no problem with the substrate-potential-fixing PMIS transistor 25 being ON, whereas when a high voltage is applied to the external connection pad 1, the substrate-potential-fixing PMIS transistor 25 is OFF, whereby care should be taken to ensure that it will not hinder the operation of the semiconductor integrated circuit device. When a high voltage is applied to the external connection pad 1 and the substrate-potential-fixing PMIS transistor 25 is OFF, a positive charge having passed through the parasitic forward diodes 9 and 13 flows into the drain of the substrate-potential-fixing PMIS transistor 25 to increase the potential of the node extending from the substrate region (n well) of each of the PMIS transistors 5 and 11 to the drain of the substrate-potential-fixing PMIS transistor 25, thereby fixing the substrate potential of each of the PMIS transistors 5 and 11. Thus, no problem will arise during actual use.

Fourth Embodiment

Figure 4:
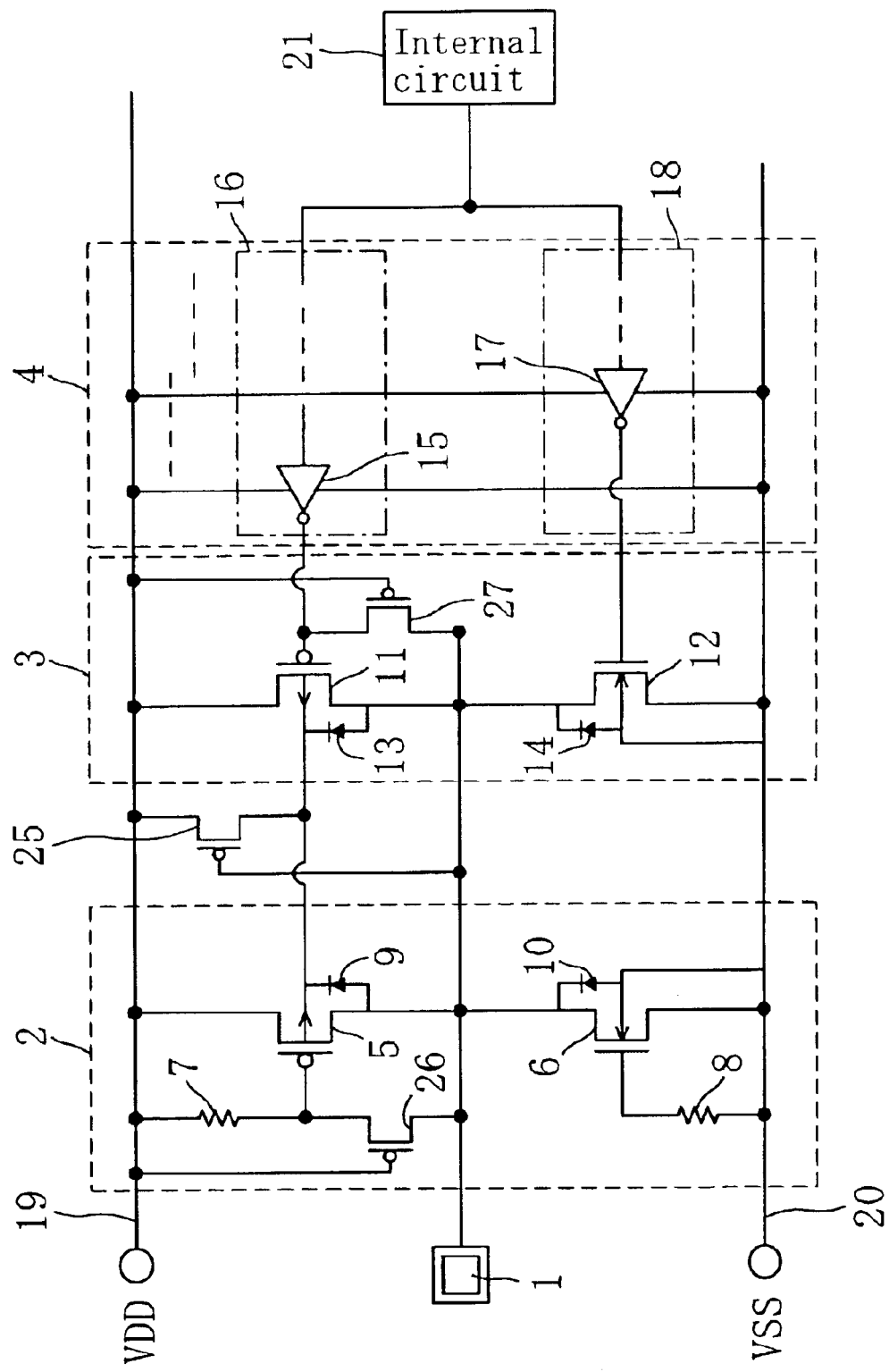
FIG. 4 is an electric circuit diagram illustrating a configuration of an output circuit and other elements around the output circuit in a semiconductor integrated circuit device according to the fourth embodiment of the present invention.

FIG. 4 is an electric circuit diagram illustrating a configuration of an output circuit and other elements around the output circuit in a semiconductor integrated circuit device including an electrostatic discharge protection circuit according to the fourth embodiment of the present invention. As illustrated in FIG. 4, the semiconductor integrated circuit device includes an external connection pad 1, an electrostatic discharge protection circuit 2, an output circuit 3, an output pre-buffer circuit 4 and an internal circuit 21, and is configured so that the output circuit 3 is protected by the electrostatic discharge protection circuit 2 from a surge entering through the external connection pad 1. A feature of the present embodiment is the provision of gate-potential-fixing PMIS transistors 26 and 27 in addition to the elements of the third embodiment.

The electrostatic discharge protection circuit 2 is provided between the external connection pad 1 and the output circuit 3, and includes a PMIS transistor 5, an NMIS transistor 6, a first resistor 7, a second resistor 8 and the gate-potential-fixing PMIS transistor 26. The PMIS transistor 5 includes a source connected to the power supply line 19 for supplying a power supply voltage VDD, a gate connected to the power supply line 19 via the first resistor 7, a drain connected to the external connection pad 1, and a substrate region (n well) connected to the drain of a substrate-potential-fixing PMIS transistor 25. Moreover, the NMIS transistor 6 includes a source connected to a ground line 20 for supplying a ground voltage VSS, a gate connected to the ground line 20 via the second resistor 8, a drain connected to the external connection pad 1, and a substrate region (p well) connected to the ground line 20. Furthermore, the gate-potential-fixing PMIS transistor 26 includes a drain connected to the gate of the PMIS transistor 5, a gate connected to the power supply line 19, and a source connected to the external connection pad 1.

The output circuit 3 is provided between the electrostatic discharge protection circuit 2 and the output pre-buffer circuit 4, and includes a PMIS transistor 11, an NMIS transistor 12 and the gate-potential-fixing PMIS transistor 27. The PMIS transistor 11 includes a source connected to the power supply line 19, a gate connected to an output terminal of a first pre-buffer 15 of the output pre-buffer circuit 4, a drain connected to the external connection pad 1, and a substrate region (n well) connected to the drain of the substrate-potential-fixing PMIS transistor 25. Moreover, the NMIS transistor 12 includes a source connected to the ground line 20, a gate connected to an output terminal of a second pre-buffer 17 of the output pre-buffer circuit 4, a drain connected to the external connection pad 1, and a substrate region (p well) connected to the ground line 20. Furthermore, the gate-potential-fixing PMIS transistor 27 includes a drain connected to the gate of the PMIS transistor 11, a gate connected to the power supply line 19, and a source connected to the external connection pad 1.

The output pre-buffer circuit 4 for amplifying an output signal from the internal circuit 21 is provided between the internal circuit 21 and the output circuit 3, and includes a first pre-buffer circuit 16 that includes the first pre-buffer 15 in the last stage and a second pre-buffer current 18 that includes the second pre-buffer 17 in the last stage. The first pre-buffer 15 includes a power supply voltage terminal connected to the power supply line 19, a ground terminal connected to the ground line 20, an output terminal connected to the gate of the PMIS transistor 11 of the output circuit 3, and an input terminal connected to the internal circuit 21. Moreover, the second pre-buffer 17 includes a power supply voltage terminal connected to the power supply line 19, a ground terminal connected to the ground line 20, an output terminal connected to the gate of the NMIS transistor 12 of the output circuit 3, and an input terminal connected to the internal circuit 21. Note that the first pre-buffer circuit 16 and the second pre-buffer current 18 each include a plurality of pre-buffers according to the degree of amplification by which an output signal from the internal circuit 21 is to be amplified. The first and second pre-buffer circuits 16 and 18 are configured so that two high and low output signals or two identical output signals are output from the output terminal of the first pre-buffer 15 in the last stage in the first pre-buffer circuit 16 and from the output terminal of the second pre-buffer 17 in the last stage in the second pre-buffer current 18.

The gate of the substrate-potential-fixing PMIS transistor 25 is connected to the external connection pad 1, and the source thereof is connected to the power supply line 19.

With the semiconductor integrated circuit device of the present embodiment, effects as those of the third embodiment can be provided by a portion having the same configuration as that of the third embodiment. In addition, the present embodiment provides the following effect.

In each of the PMIS transistor 26 and the PMIS transistor 27, the gate is connected to the power supply line 19 and the drain is connected to the external connection pad 1. Therefore, when a positive charge is applied to the external connection pad 1 in an ESD test, the drain potential is higher than the gate potential in the PMIS transistor 26 and the PMIS transistor 27, thereby turning ON the PMIS transistor 26 and the PMIS transistor 27. Thus, a charge applied to the external connection pad 1 is transferred to the gate of the PMIS transistor 5 and to the gate of the PMIS transistor 11. Therefore, in each of the PMIS transistor 5 and the PMIS transistor 11, the drain and the gate have an equal voltage, and the PMIS transistor 5 and the PMIS transistor 11 are turned OFF, whereby it is possible to prevent an increase in the potential of the power supply line 19. As a result, it is possible to block the surge charge creeping path extending from the parasitic forward diodes 9 and 13 and the PMIS transistors 5 and 11 to the power supply line 19.

In the third embodiment, although the creepage of a surge charge from the parasitic forward diodes 9 and 13 to the power supply line 19 can be blocked, a surge charge having passed through the PMIS transistors 5 and 11 may possibly creep to the power supply line 19 under certain circumstances. In contrast, in the present embodiment, it is possible to also block the surge charge creeping path extending from the PMIS transistors 5 and 11 to the power supply line 19.

Thus, when an ESD test is conducted by using an evaluation circuit as illustrated in FIG. 8A based on the HBM discharge waveform specifications as illustrated in FIG. 8B, an increase in the potential of the power supply line 19, to which the power supply voltage terminal of the second pre-buffer 17 is connected, can be suppressed more reliably. Therefore, it is possible to reliably prevent a situation where the gate voltage of the NMIS transistor 12 of the output circuit 3 is increased by the output from the second pre-buffer 17, thereby turning ON the NMIS transistor 12. Thus, it is possible to prevent the local damage to the NMIS transistor and the decrease in the surge withstand voltage thereof from occurring due to the NMIS transistor 12 being turned ON.

Particularly, the present embodiment is advantageous in that it is possible to suppress a decrease in the surge withstand voltage without increasing the number of power supply pins, whereas the number of power supply pins increases according to the number of power supply lines in the first and second embodiments described above.

Moreover, also in the present embodiment, the substrate potential of each of the PMIS transistors 5 and 11 is fixed by an effect as that of the third embodiment. Thus, no problem will arise during actual use.

Note that effects as those described above can be obtained in the first embodiment and the second embodiment by providing the gate-potential-fixing PMIS transistors 26 and 27 of the present embodiment in the electrostatic discharge protection circuit 2 and the output circuit 3, respectively.

Fifth Embodiment

Figure 5:
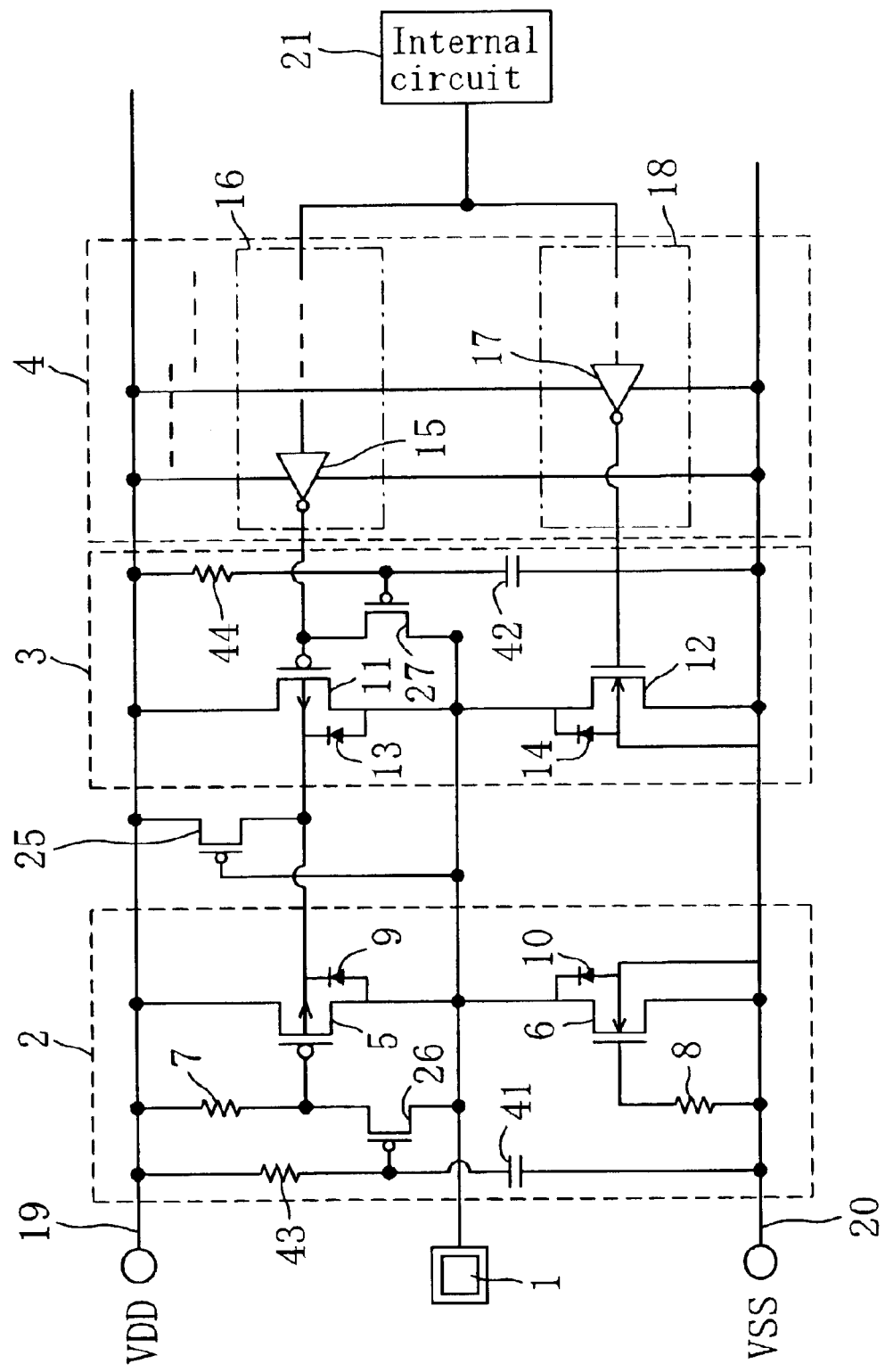
FIG. 5 is an electric circuit diagram illustrating a configuration of an output circuit and other elements around the output circuit in a semiconductor integrated circuit device according to the fifth embodiment of the present invention.

FIG. 5 is an electric circuit diagram illustrating a configuration of an output circuit and other elements around the output circuit in a semiconductor integrated circuit device including an electrostatic discharge protection circuit according to the fifth embodiment of the present invention. As illustrated in FIG. 5, the semiconductor integrated circuit device includes an external connection pad 1, an electrostatic discharge protection circuit 2, an output circuit 3, an output pre-buffer circuit 4 and an internal circuit 21, and is configured so that the output circuit 3 is protected by the electrostatic discharge protection circuit 2 from a surge entering through the external connection pad 1. A feature of the present embodiment is the provision of potential-fixing capacitors 41 and 42 and time-constant-adjusting resistors 43 and 44, which are connected to the respective gates of gate-potential-fixing PMIS transistors 26 and 27, in addition to the elements of the fourth embodiment.

The electrostatic discharge protection circuit 2 is provided between the external connection pad 1 and the output circuit 3, and includes a PMIS transistor 5, an NMIS transistor 6, a first resistor 7, a second resistor 8, the gate-potential-fixing PMIS transistor 26, the potential-fixing capacitor 41 and the time-constant-adjusting resistor 43. The PMIS transistor 5 includes a source connected to the power supply line 19 for supplying a power supply voltage VDD, a gate connected to the power supply line 19 via the first resistor 7, a drain connected to the external connection pad 1, and a substrate region (n well) connected to the drain of a substrate-potential-fixing PMIS transistor 25. Moreover, the NMIS transistor 6 includes a source connected to a ground line 20 for supplying a ground voltage VSS, a gate connected to the ground line 20 via the second resistor 8, a drain connected to the external connection pad 1, and a substrate region (p well) connected to the ground line 20. Furthermore, the gate-potential-fixing PMIS transistor 26 includes a drain connected to the gate of the PMIS transistor 5, a gate connected to the power supply line 19 via the time-constant-adjusting resistor 43, and a source connected to the external connection pad 1. Furthermore, one electrode of the potential-fixing capacitor 41 is connected to the gate of the gate-potential-fixing PMIS transistor 26, and the other electrode thereof is connected to the ground.

The output circuit 3 is provided between the electrostatic discharge protection circuit 2 and the output pre-buffer circuit 4, and includes a PMIS transistor 11, an NMIS transistor 12, the gate-potential-fixing PMIS transistor 27, the potential-fixing capacitor 42 and the time-constant-adjusting resistor 44. The PMIS transistor 11 includes a source connected to the power supply line 19, a gate connected to an output terminal of a first pre-buffer 15 of the output pre-buffer circuit 4, a drain connected to the external connection pad 1, and a substrate region (n well) connected to the drain of the substrate-potential-fixing PMIS transistor 25. Moreover, the NMIS transistor 12 includes a source connected to the ground line 20, a gate connected to an output terminal of a second pre-buffer 17 of the output pre-buffer circuit 4, a drain connected to the external connection pad 1, and a substrate region (p well) connected to the ground line 20. Furthermore, the gate-potential-fixing PMIS transistor 27 includes a drain connected to the gate of the PMIS transistor 11, a gate connected to the power supply line 19 via the time-constant-adjusting resistor 44, and a source connected to the external connection pad 1. Furthermore, one electrode of the potential-fixing capacitor 42 is connected to the gate of the gate-potential-fixing PMIS transistor 27, and the other electrode thereof is connected to the ground.

The output pre-buffer circuit 4 for amplifying an output signal from the internal circuit 21 is provided between the internal circuit 21 and the output circuit 3, and includes a first pre-buffer circuit 16 that includes the first pre-buffer 15 in the last stage and a second pre-buffer current 18 that includes the second pre-buffer 17 in the last stage. The first pre-buffer 15 includes a power supply voltage terminal connected to the power supply line 19, a ground terminal connected to the ground line 20, an output terminal connected to the gate of the PMIS transistor 11 of the output circuit 3, and an input terminal connected to the internal circuit 21. Moreover, the second pre-buffer 17 includes a power supply voltage terminal connected to the power supply line 19, a ground terminal connected to the ground line 20, an output terminal connected to the gate of the NMIS transistor 12 of the output circuit 3, and an input terminal connected to the internal circuit 21. Note that the first pre-buffer circuit 16 and the second pre-buffer current 18 each include a plurality of pre-buffers according to the degree of amplification by which an output signal from the internal circuit 21 is to be amplified. The first and second pre-buffer circuits 16 and 18 are configured so that two high and low output signals or two identical output signals are output from the output terminal of the first pre-buffer 15 in the last stage in the first pre-buffer circuit 16 and from the output terminal of the second pre-buffer 17 in the last stage in the second pre-buffer current 18.

The gate of the substrate-potential-fixing PMIS transistor 25 is connected to the external connection pad 1, and the source thereof is connected to the power supply line 19.

With the semiconductor integrated circuit device of the present embodiment, effects as those of the fourth embodiment can be provided by a portion having the same configuration as that of the fourth embodiment. In addition, the present embodiment provides the following effect.

In the fourth embodiment, the gate of each of the gate-potential-fixing PMIS transistors 26 and 27 is connected to the power supply line 19. During an ESD test, the power supply line 19 is floating, whereby the turning ON of the gate-potential-fixing PMIS transistors 26 and 27 may possibly be delayed. In contrast, in the present embodiment, the gate of each of the gate-potential-fixing PMIS transistors 26 and 27 is held at a low potential close to the ground potential by the potential-fixing capacitors 41 and 42, respectively, from the beginning of an ESD test, whereby the gate-potential-fixing PMIS transistors 26 and 27 can be turned ON quickly. Thus, the PMIS transistors 5 and 11 are turned OFF immediately, whereby it is possible to prevent an increase in the potential of the power supply line 19. Therefore, it is possible to block the surge charge creeping path extending from the parasitic forward diodes 9 and 13 and the PMIS transistors 5 and 11 to the power supply line 19.

Moreover, after passage of a certain period of time, the gate potential of each of the gate-potential-fixing PMIS transistors 26 and 27 may possibly become high due to the movement of a charge from the floating power supply line 19. However, it is possible to more reliably prevent an increase in the potential of the power supply line 19 by setting the resistance of the time-constant-adjusting resistors 43 and 44 so that the ESD test is completed before the gate potential increases.

Moreover, also in the present embodiment, the substrate potential of each of the PMIS transistors 5 and 11 is fixed by an effect as that of the fourth embodiment. Thus, no problem will arise during actual use.

Note that also in a case where the gate-potential-fixing PMIS transistors 26 and 27 of the present embodiment are provided in the electrostatic discharge protection circuit 2 and the output circuit 3, respectively, in the second embodiment, it is possible to obtain effects as those described above by providing the potential-fixing capacitors 41 and 42 and the time-constant-adjusting resistors 43 and 44 as in the present embodiment.

Variation of Embodiment

Figure 6:
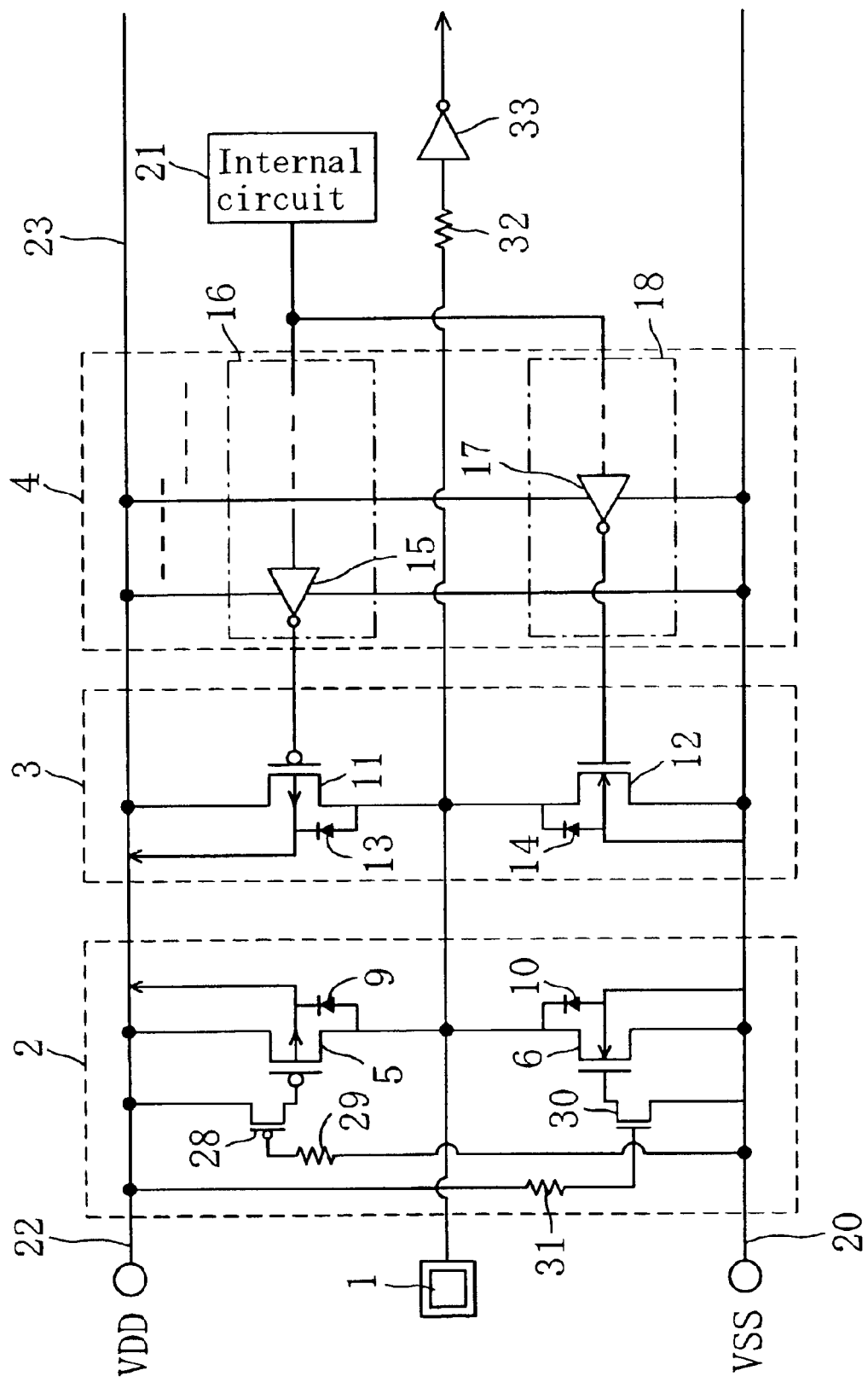
FIG. 6 is an electric circuit diagram illustrating a configuration of an output circuit and other elements around the output circuit in a semiconductor integrated circuit device according to a variation of the first embodiment of the present invention.
Figure 7:
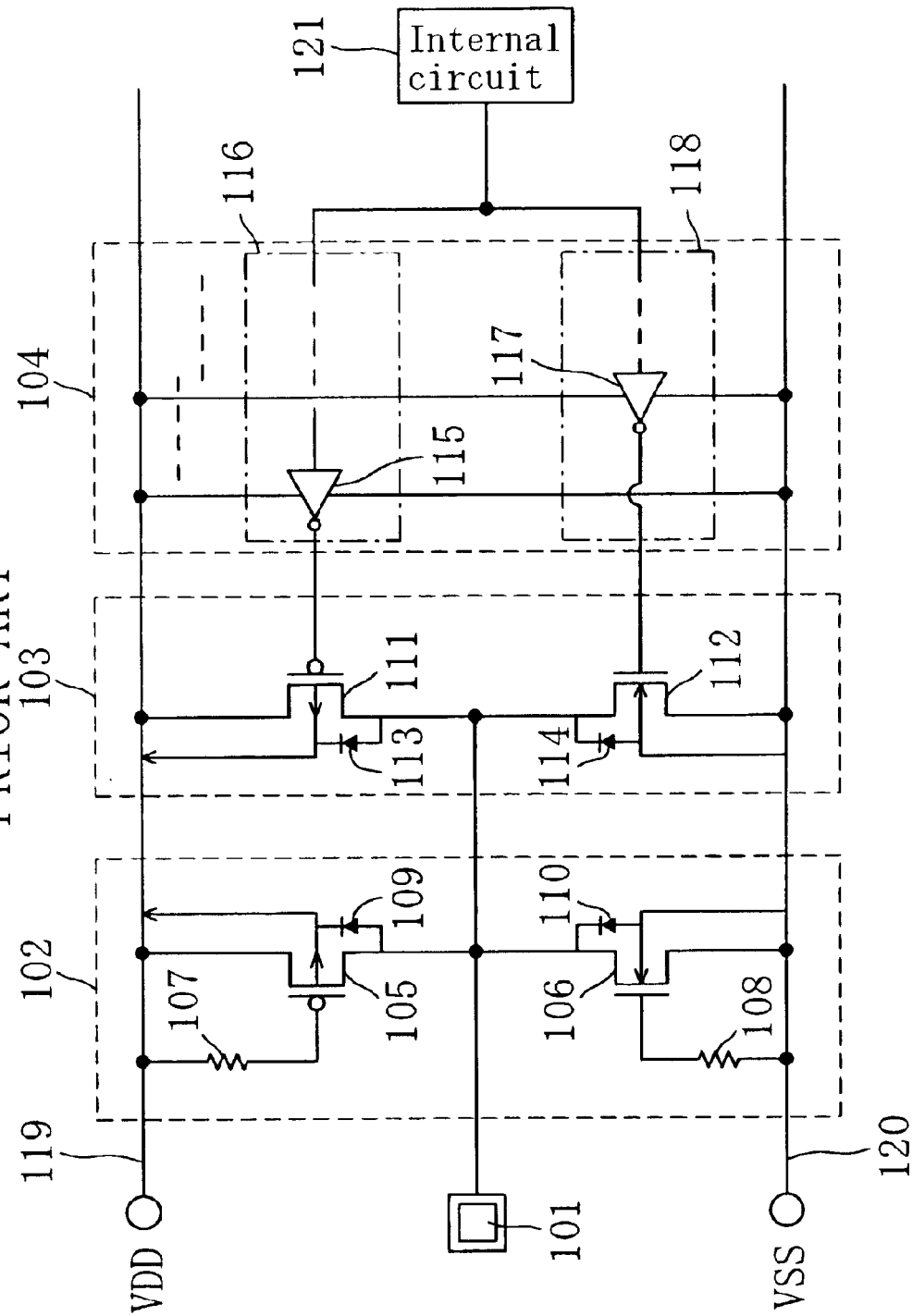
FIG. 7 is an electric circuit diagram illustrating a configuration of an output circuit and other elements around the output circuit in a conventional semiconductor integrated circuit device including an electrostatic discharge protection circuit.

FIG. 6 is an electric circuit diagram illustrating a configuration of an output circuit and other elements around the output circuit in a semiconductor integrated circuit device including an electrostatic discharge protection circuit according to a variation of the first embodiment of the present invention.

As illustrated in FIG. 6, the semiconductor integrated circuit device of the present variation has basically the same configuration as that of the first embodiment. Specifically, the semiconductor integrated circuit device includes the external connection pad 1, the electrostatic discharge protection circuit 2, the output circuit 3, the output pre-buffer circuit 4 and the internal circuit 21, and is configured so that the output circuit 3 is protected by the electrostatic discharge protection circuit 2 from a surge entering through the external connection pad 1.

The first difference between the present variation and the first embodiment is that the present variation employs a PMIS transistor 28 and a resistor 29, instead of the first resistor 7 of the electrostatic discharge protection circuit 2 of the first embodiment, and an NMIS transistor 30 and a resistor 31, instead of the second resistor 8 of the electrostatic discharge protection circuit 2 of the first embodiment. The PMIS transistor 28 includes a drain connected to the gate of the PMIS transistor 5, a gate connected to the ground line 20 via the resistor 29, and a source connected to the first power supply line 22. Moreover, the NMIS transistor 30 includes a drain connected to the gate of the NMIS transistor 6, a gate connected to the first power supply line 22 via the resistor 31, and a source connected to the ground line 20.

Thus, by replacing a resistor with a MIS transistor, it is possible to reduce the area to be occupied by the semiconductor integrated circuit device.

Note that effects as those described above can be obtained also in the second to fourth embodiments by employing the PMIS transistor 28 and the resistor 29, instead of the first resistor 7, and employing the NMIS transistor 30 and the resistor 31, instead of the second resistor 8, as in the present variation.

Furthermore, the second difference between the present variation and the first embodiment is that an input buffer circuit 33 is connected to the external connection pad 1 via a protection resistor 32. With such a configuration, the output circuit 3 and the input buffer circuit 33 can be more reliably protected by the electrostatic discharge protection circuit 2 from a surge entering through the external connection pad 1.

Note that also in the second to fourth embodiments, the electrostatic discharge protection circuit 2 can be used as a protection circuit of the output circuit 3 and the input buffer circuit 33 by connecting the input buffer circuit 33 to the external connection pad 1 via the protection resistor 32, as in the present variation.

In the first to fifth embodiments and the variation, the output pre-buffer circuit 4 includes the first pre-buffer circuit 16 connected to the PMIS transistor 11 and the second pre-buffer current 18 connected to the NMIS transistor 12. Alternatively, a single pre-buffer circuit may be used to amplify a signal from the internal circuit, with the output terminal of the pre-buffer in the last stage being connected to the gate of each of the PMIS transistor 11 and the NMIS transistor 12.

What is claimed is:

1. A semiconductor integrated circuit device, comprising:
    an external connection pad;
    an electrostatic discharge protection circuit connected to the external connection pad;
    an output circuit connected to the external connection pad;
    an output pre-buffer circuit connected to the output circuit;
    a first power supply line for supplying a power supply voltage to the electrostatic discharge protection circuit and the output circuit; and
    a second power supply line for supplying a power supply voltage to the output pre-buffer circuit,
    wherein the first power supply line and the second power supply line are not electrically connected to each other.

2. The semiconductor integrated circuit device of claim 1, further comprising:
    an input buffer circuit connected to the external connection pad; and
    a protection resistor provided between the external connection pad and the input buffer circuit.

3. The semiconductor integrated circuit device of claim 1, wherein:
    the electrostatic discharge protection circuit includes a first PMIS transistor and a first NMIS transistor, the first PMIS transistor including a source connected to the first power supply line, a drain connected to the external connection pad and an n-type substrate region connected to the first power supply line, and the first NMIS transistor including a source connected to a ground line, a drain connected to the external connection pad and a p-type substrate region connected to the ground line;
    the output pre-buffer circuit includes a first pre-buffer circuit and a second pre-buffer circuit, the first pre-buffer circuit including, in a last stage, a first pre-buffer whose power supply terminal is connected to the second power supply line, and the second pre-buffer circuit including, in a last stage, a second pre-buffer whose power supply terminal is connected to the second power supply line; and
    the output circuit includes a second PMIS transistor and a second NMIS transistor, the second PMIS transistor including a source connected to the first power supply line, a drain connected to the external connection pad, a gate connected to an output terminal of the first pre-buffer and an n-type substrate region connected to the first power supply line, and the second NMIS transistor including a source connected to a ground line, a drain connected to the external connection pad, a gate connected to an output terminal of the second pre-buffer and a p-type substrate region connected to the ground line.

4. The semiconductor integrated circuit device of claim 3, further comprising:
    a first resistor provided between a gate of the first PMIS transistor and the first power supply line; and
    a second resistor provided between a gate of the first NMIS transistor and the ground line.

5. The semiconductor integrated circuit device of claim 3, further comprising:
    a third PMIS transistor including a gate connected to the ground line, a source connected to the first power supply line and a drain connected to a gate of the first PMIS transistor;
    a first resistor provided between the third PMIS transistor and the ground line;
    a third NMIS transistor including a gate connected to the first power supply line, a source connected to the ground line and a drain connected to a gate of the first NMIS transistor; and
    a second resistor provided between the gate of the third NMIS transistor and the first power supply line.

6. A semiconductor integrated circuit device, comprising:
    an external connection pad;
    an electrostatic discharge protection circuit connected to the external connection pad and including an n-type substrate region;
    an output circuit connected to the external connection pad and including an n-type substrate region;
    an output pre-buffer circuit connected to the output circuit;
    a first power supply line for supplying a power supply voltage to the electrostatic discharge protection circuit and the output circuit; and
    a second power supply line for fixing a potential of the n-type substrate region of each of the electrostatic discharge protection circuit and the output circuit,
    wherein the first power supply line and the second power supply line are not electrically connected to from each other.

7. The semiconductor integrated circuit device of claim 6, further comprising:
    an input buffer circuit connected to the external connection pad; and
    a protection resistor provided between the external connection pad and the input buffer circuit.

8. The semiconductor integrated circuit device of claim 6, wherein:
    the electrostatic discharge protection circuit includes a first PMIS transistor and a first NMIS transistor, the first PMIS transistor including a source connected to the first power supply line, a drain connected to the external connection pad and the n-type substrate region connected to the second power supply line, and the first NMIS transistor including a source connected to a ground line, a drain connected to the external connection pad and a p-type substrate region connected to the ground line;

the output pre-buffer circuit includes a first pre-buffer circuit and a second pre-buffer circuit, the first pre-buffer circuit including, in a last stage, a first pre-buffer whose power supply terminal is connected to the first power supply line, and the second pre-buffer circuit including, in a last stage, a second pre-buffer whose power supply terminal is connected to the first power supply line; and the output circuit includes a second PMIS transistor and a second NMIS transistor, the second PMIS transistor including a source connected to the first power supply line, a drain connected to the external connection pad, a gate connected to an output terminal of the first pre-buffer and the n-type substrate region connected to the second power supply line, and the second NMIS transistor including a source connected to a ground line, a drain connected to the external connection pad, a gate connected to an output terminal of the second pre-buffer and a p-type substrate region connected to the ground line.

9. The semiconductor integrated circuit device of claim 8, further comprising:

a first resistor provided between a gate of the first PMIS transistor and the first power supply line; and a second resistor provided between a gate of the first NMIS transistor and the ground line.

10. The semiconductor integrated circuit device of claim 8, further comprising:

a third PMIS transistor including a gate connected to the ground line, a source connected to the first power supply line and a drain connected to a gate of the first PMIS transistor;

a first resistor provided between the third PMIS transistor and the ground line;

a third NMIS transistor including a gate connected to the first power supply line, a source connected to the ground line and a drain connected to a gate of the first NMIS transistor; and a second resistor provided between the gate of the third NMIS transistor and the first power supply line.

11. The semiconductor integrated circuit device of claim 9, further comprising:

a fourth PMIS transistor including a gate connected to the first power supply line, a source connected to the external connection pad and a drain connected to the gate of the first PMIS transistor; and a fifth PMIS transistor including a gate connected to the first power supply line, a source connected to the external connection pad and a drain connected to the gate of the second PMIS transistor.

12. A semiconductor integrated circuit device, comprising:

an external connection pad;

an electrostatic discharge protection circuit connected to the external connection pad and including an n-type substrate region;

an output circuit connected to the external connection pad and including an n-type substrate region;

an output pre-buffer circuit connected to the output circuit;

a power supply line for supplying a power supply voltage to the electrostatic discharge protection circuit, the output circuit and the output pre-buffer circuit; and a substrate-potential-fixing PMIS transistor for fixing a potential of the n-type substrate region of each of the electrostatic discharge protection circuit and the output circuit, the substrate-potential-fixing PMIS transistor including a gate connected to the external connection pad, a source connected to the power supply line and a drain connected to the n-type substrate region of each of the electrostatic discharge protection circuit and the output circuit.

13. The semiconductor integrated circuit device of claim 12, further comprising:

an input buffer circuit connected to the external connection pad; and a protection resistor provided between the external connection pad and the input buffer circuit.

14. The semiconductor integrated circuit device of claim 12, wherein:

the electrostatic discharge protection circuit includes a first PMIS transistor and a first NMIS transistor, the first PMIS transistor including a source connected to the power supply line, a drain connected to the external connection pad and the n-type substrate region connected to the drain of the substrate-potential-fixing PMIS transistor, and the first NMIS transistor including a source connected to a ground line, a drain connected to the external connection pad and a p-type substrate region connected to the ground line;

the output pre-buffer circuit includes a first pre-buffer circuit and a second pre-buffer circuit, the first pre-buffer circuit including, in a last stage, a first pre-buffer whose power supply terminal is connected to the power supply line, and the second pre-buffer circuit including, in a last stage, a second pre-buffer whose power supply terminal is connected to the power supply line; and the output circuit includes a second PMIS transistor and a second NMIS transistor, the second PMIS transistor including a source connected to the power supply line, a drain connected to the external connection pad, a gate connected to an output terminal of the first pre-buffer and the n-type substrate region connected to the drain of the substrate-potential-fixing PMIS transistor, and the second NMIS transistor including a source connected to a ground line, a drain connected to the external connection pad, a gate connected to an output terminal of the second pre-buffer and a p-type substrate region connected to the ground line.

15. The semiconductor integrated circuit device of claim 14, further comprising:

a first resistor provided between a gate of the first PMIS transistor and the power supply line; and a second resistor provided between a gate of the first NMIS transistor and the ground line.

16. The semiconductor integrated circuit device of claim 14, further comprising:

a third PMIS transistor including a gate connected to the ground line, a source connected to the power supply line and a drain connected to a gate of the first PMIS transistor;

a first resistor provided between the third PMIS transistor and the ground line;

a third NMIS transistor including a gate connected to the power supply line, a source connected to the ground line and a drain connected to a gate of the first NMIS transistor; and a second resistor provided between the gate of the third NMIS transistor and the power supply line.

17. The semiconductor integrated circuit device of claim 15, further comprising:
   a fourth PMIS transistor including a gate connected to the power supply line, a source connected to the external connection pad and a drain connected to the gate of the first PMIS transistor; and
   a fifth PMIS transistor including a gate connected to the power supply line, a source connected to the external connection pad and a drain connected to the gate of the second PMIS transistor.

18. The semiconductor integrated circuit device of claim 17, further comprising:
   a first time-constant-adjusting resistor provided between the gate of the fourth PMIS transistor and the power supply line;
   a first potential-fixing capacitor having one pole connected to the gate of the fourth PMIS transistor and the other pole connected to the ground line;
   a second time-constant-adjusting resistor provided between the gate of the fifth PMIS transistor and the power supply line; and
   a second potential-fixing capacitor having one pole connected to the gate of the fifth PMIS transistor and the other pole connected to the ground line.

* * * * *